US010804213B2

(12) United States Patent
Takizawa

(10) Patent No.: US 10,804,213 B2
(45) Date of Patent: Oct. 13, 2020

(54) CIRCUIT APPARATUS

(71) Applicants: Kabushiki Kaisha Toshiba, Minato-ku, Tokyo (JP); Toshiba Electronic Devices & Storage Corporation, Minato-ku, Tokyo (JP)

(72) Inventor: Minoru Takizawa, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 47 days.

(21) Appl. No.: 16/284,140

(22) Filed: Feb. 25, 2019

(65) Prior Publication Data

US 2019/0355669 A1 Nov. 21, 2019

(30) Foreign Application Priority Data

May 17, 2018 (JP) ................................. 2018-095784

(51) Int. Cl.
*H01L 23/552* (2006.01)
*H01L 25/18* (2006.01)
(Continued)

(52) U.S. Cl.
CPC ...... *H01L 23/552* (2013.01); *H01L 23/49811* (2013.01); *H01L 23/5383* (2013.01);
(Continued)

(58) Field of Classification Search
CPC ... H05K 1/11; H05K 1/14; H05K 1/18; H05K 1/141–144; H05K 1/181–188;
(Continued)

(56) References Cited

U.S. PATENT DOCUMENTS 8,809,694 B2 8/2014 Yoshida
8,849,362 B1 9/2014 Saji et al.
(Continued)

FOREIGN PATENT DOCUMENTS

JP 2004-015160 A 1/2004
JP 2006-101494 A 4/2006
(Continued)

*Primary Examiner* — Tuan T Dinh
(74) *Attorney, Agent, or Firm* — White & Case LLP

(57) ABSTRACT

A circuit apparatus according to an embodiment includes: a wiring substrate having a wiring; a first electronic component provided on the wiring substrate; a second electronic component provided on the wiring substrate, the second electronic component having a height higher than a height of the first electronic component; a sealing member provided on the wiring substrate, the sealing member covering the first electronic component and the second electronic component, a first distance between a first surface of the sealing member above the first electronic component and the wiring substrate being shorter than a second distance between a second surface of the sealing member above the second electronic component and the wiring substrate; and a conductive member provided on the sealing member, the conductive member exposing the second surface, a third distance between a third surface of the conductive member provided above the first electronic component and the wiring substrate being equal to the second distance, and a film thickness of the conductive member at the third surface being thicker than a film thickness of the conductive member at a fourth surface provided between the third surface and the second surface.

10 Claims, 5 Drawing Sheets

(51) Int. Cl.
  *H01L 23/538* (2006.01)
  *H01L 23/498* (2006.01)
  *H01L 23/66* (2006.01)
  *H01Q 1/52* (2006.01)
  *H01Q 9/04* (2006.01)
  *H01Q 1/22* (2006.01)

(52) U.S. Cl.
  CPC .......... *H01L 23/5386* (2013.01); *H01L 23/66* (2013.01); *H01L 25/18* (2013.01); *H01Q 1/526* (2013.01); *H01L 2223/6677* (2013.01); *H01Q 1/2283* (2013.01); *H01Q 9/0421* (2013.01)

(58) Field of Classification Search
  CPC .......... H05K 5/00; H01L 23/31; H01L 23/60; H01L 23/3114; H01L 23/552; H01L 21/52; H01L 21/56
  USPC ........ 361/760–764, 782–784, 803, 816, 818; 257/660–730, 787–790
  See application file for complete search history.

(56) References Cited

U.S. PATENT DOCUMENTS

| | | | |
|---|---|---|---|
| 8,890,309 | B1 | 11/2014 | Mugiya et al. |
| 9,007,273 | B2* | 4/2015 | Liao ............... H01L 23/481 |
| | | | 343/841 |
| 9,239,386 | B2* | 1/2016 | Elian ............... B81B 7/0061 |
| 10,327,076 | B1* | 6/2019 | Syed ............... H04R 9/08 |
| 2010/0207257 | A1* | 8/2010 | Lee ............... H01L 23/552 |
| | | | 257/660 |
| 2013/0223038 | A1* | 8/2013 | Yamamoto ........... H05K 3/0097 |
| | | | 361/807 |

FOREIGN PATENT DOCUMENTS

| | | |
|---|---|---|
| JP | 2007-129304 A | 5/2007 |
| JP | 5527785 B1 | 6/2014 |
| JP | 5668627 B2 | 2/2015 |
| JP | 6285228 B2 | 2/2018 |

* cited by examiner

CIRCUIT APPARATUS

CROSS-REFERENCE TO RELATED APPLICATION

This application is based upon and claims the benefit of priority from Japanese Patent Application No. 2018-095784, filed on May 17, 2018, the entire contents of which are incorporated herein by reference.

FIELD

Embodiments described herein relate generally to a circuit apparatus.

BACKGROUND

In a circuit apparatus such as a semiconductor module, electronic components such as transistors, amplifiers and passive elements are mounted on the surface of a wiring substrate formed of an organic material or the like and a metal wiring and the like. The electronic components are sealed on the wiring substrate by a sealing member such as ceramic or resin. The circuit apparatus is mounted on a mounting substrate through a planar electrode pad and a solder ball provided on the back face of the wiring substrate and is connected to other electronic components on the mounting substrate and other circuit apparatuses.

Such a circuit apparatus has a function of protecting the electronic components from external moisture and mechanical impact. Moreover, the circuit apparatus has a function of suppressing deterioration of the electrical characteristics of the electronic components and protecting semiconductor chips and the like against charged particles from the outside. As the miniaturization and thinning of electronic devices are demanded, the miniaturization and thinning of circuit apparatuses are also requested.

Furthermore, in order to prevent electromagnetic noise, which is generated from the electronic components in the circuit apparatus and is causing malfunction of other electronic components on the mounting substrate, or in order to prevent electromagnetic noise, which is generated from other electronic components and is causing malfunction of the electronic components of the circuit apparatus, a shield has been used to cover the electronic components in the circuit apparatus.

Furthermore, in a circuit apparatus having an electronic component for transmitting and receiving a high frequency signal, an antenna connected to the electronic components has been provided in the circuit apparatus for the miniaturization and thinning.

DETAILED DESCRIPTION

Figure 1A:
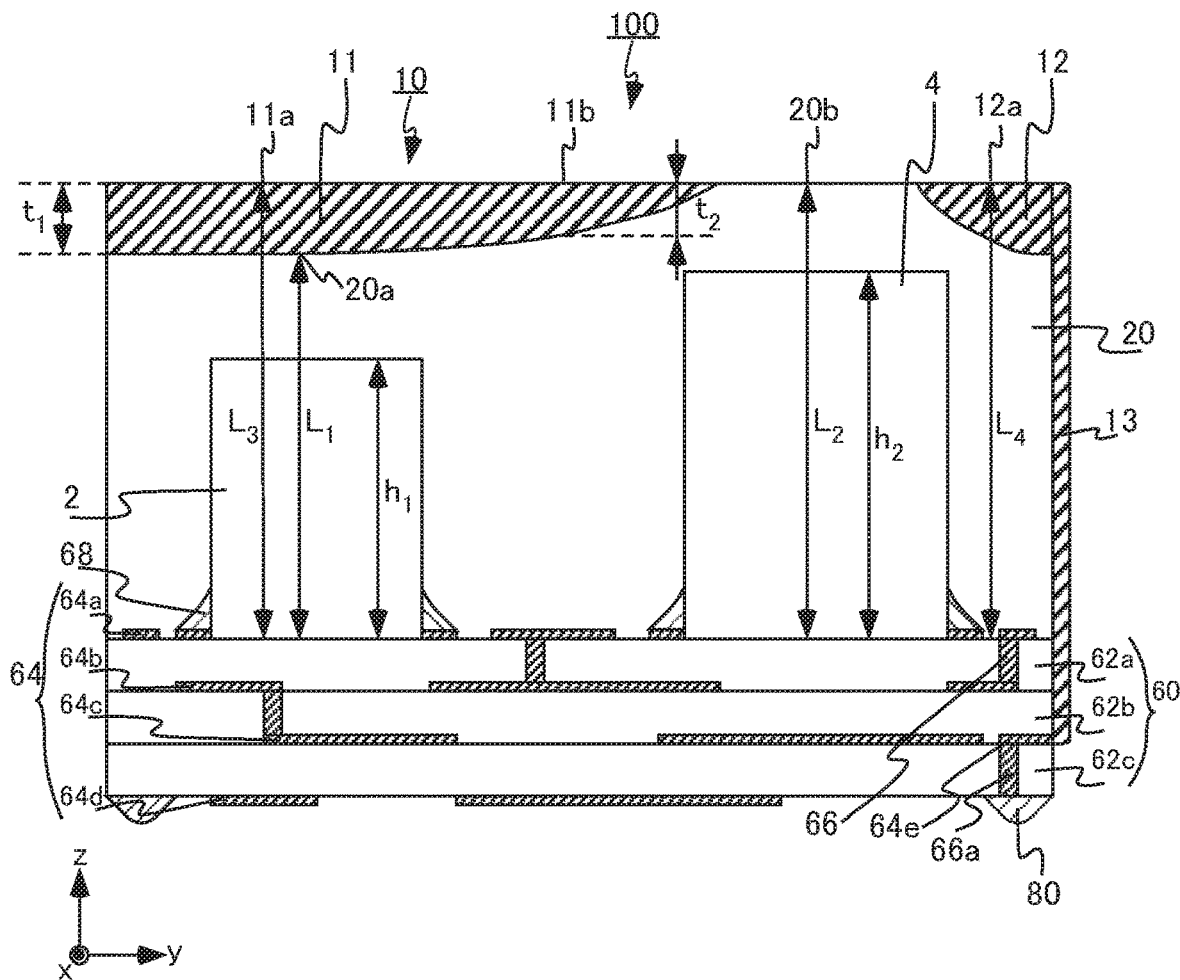
FIGS. 1A and 1B are schematic views of a circuit apparatus according to a first embodiment.

A circuit apparatus according to an embodiment includes: a wiring substrate having a wiring; a first electronic component provided on the wiring substrate; a second electronic component provided on the wiring substrate, the second electronic component having a height higher than a height of the first electronic component; a sealing member provided on the wiring substrate, the sealing member covering the first electronic component and the second electronic component, a first distance between a first surface of the sealing member above the first electronic component and the wiring substrate being shorter than a second distance between a second surface of the sealing member above the second electronic component and the wiring substrate; and a conductive member provided on the sealing member, the conductive member exposing the second surface, a third distance between a third surface of the conductive member provided above the first electronic component and the wiring substrate being equal to the second distance, and a film thickness of the conductive member at the third surface being thicker than a film thickness of the conductive member at a fourth surface provided between the third surface and the second surface.

Hereinafter, embodiments will be described with reference to the drawings. Note that the same or similar parts are denoted by the same or similar reference signs in the drawings.

In this specification, the same or similar members are denoted by the same reference signs, and redundant explanations may be omitted in some cases.

In this specification, to indicate the positional relationships of components and the like, the upward direction in the drawing is described as "upper," and the downward direction in the drawing is described as "lower." In this specification, the concepts of "upper" and "lower" are not necessarily terms indicating the relationships with the direction of gravity.

First Embodiment

A circuit apparatus according to the present embodiment includes: a wiring substrate having a wiring; a first electronic component provided on the wiring substrate; a second electronic component provided on the wiring substrate, the second electronic component having a height higher than a height of the first electronic component; a sealing member provided on the wiring substrate, the sealing member covering the first electronic component and the second electronic component, a first distance between a first surface of the sealing member above the first electronic component and the wiring substrate being shorter than a second distance between a second surface of the sealing member above the second electronic component and the wiring substrate; and a conductive member provided on the sealing member, the conductive member exposing the second surface, a third distance between a third surface of the conductive member provided above the first electronic component and the wiring substrate being equal to the second distance, and a film thickness of the conductive member at the third surface being thicker than a film thickness of the conductive member at a fourth surface provided between the third surface and the second surface.

Figure 1B:
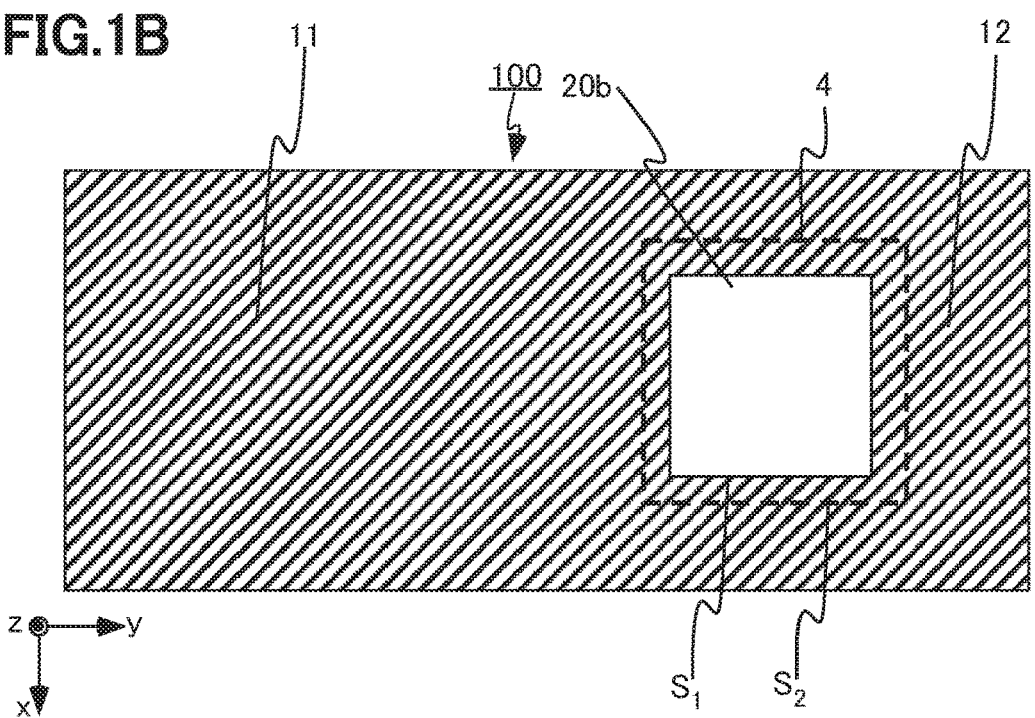

FIGS. 1A and 1B are schematic views of a circuit apparatus 100 according to the present embodiment. The circuit apparatus 100 according to the present embodiment is an electronic component module in which conductive members 11, 12 and 13 are shields.

Herein, an x axis, a y axis perpendicular to the x axis, and a z axis perpendicular to the x axis and the y axis are defined. FIG. 1A is a schematic sectional view of the circuit apparatus 100 in a plane parallel to the yz plane. FIG. 1B is a top schematic view of the circuit apparatus 100 in a plane parallel to the xy plane.

A wiring substrate 60 has a plurality of placoid insulation base materials 62a, 62b and 62c and a wiring 64. The wiring 64 has wirings 64a, 64b, 64c, 64d and 64e.

The insulation base materials 62a, 62b and 62c are placoid members made by using, for example, an epoxy resin, a melamine derivative, a liquid crystal polymer, a polyphenylene ether (PPE) resin, a fluororesin, a phenol resin, a polyaminobismaleimide (PABM) resin, or the like.

The wirings 64a, 64b, 64c, 64d and 64e are formed by, for example, removing, with a chemical or the like, unnecessary portions from metal foil, such as copper, adhered to the surfaces of the insulation base materials 62a, 62b and 62c. Then, the wiring substrate 60 is formed by laminating the insulation base materials 62a, 62b and 62c on which the wirings 64a, 64b, 64c, 64d and 64e are formed. Each of the wirings 64a, 64b, 64c, 64d and 64e is electrically connected using a via 66 made by using a metal material such as copper in the insulation base materials 62a, 62b and 62c.

The wiring substrate 60 according to the present embodiment is a four-layer substrate provided with four layers of the wirings 64a, 64b, 64c (64e) and 64d. However, the number of layers is not limited to four layers.

Moreover, each of the insulation base materials 62a, 62b and 62c may be made of different materials. Furthermore, each of the wirings 64a, 64b, 64c, 64d and 64e may be made of different materials.

An external extraction electrode 80 is provided on the lower side of the wiring substrate 60. In a case where the circuit apparatus 100 is a ball grid array (BGA) package, the external extraction electrode 80 is a solder ball. Further, in a case where the circuit apparatus 100 is a land grid array (LGA) package, the external extraction electrode 80 is a placoid electrode.

A first electronic component 2 and a second electronic component 4 are provided on the wiring substrate 60. Specifically, the first electronic component 2 and the second electronic component 4 are, for example, connected to the wiring 64a provided on the wiring substrate 60 by solder 68 to be mounted on the wiring substrate 60. Note that the way of mounting the first electronic component 2 and the second electronic component 4 is not limited to the above method.

The first electronic component 2 and the second electronic component 4 are, for example, modules such as integrated circuit (IC) modules in which a transistor, a diode, passive elements such as a capacitor and a resistor, a band pass filter (BPF), a balun, an amplification device such as an amplifier, and a crystal oscillator, or these electronic components are integrated.

The heights of the first electronic component 2 and the second electronic component 4 are, for example, about 1 mm. The height tolerance of the electronic components is usually about ±0.1 mm. And, the variation in the height of the solder is about ±50 µm.

A height $h_2$ of the second electronic component 4 is higher than a height $h_1$ of the first electronic component 2, that is, $h_2 > h_1$. Moreover, the first electronic component 2 is preferably a component such as a crystal oscillator or a module including a crystal oscillator, and the second electronic component 4 is preferably an amplification device such as an amplifier or a module including an amplification device.

Note that the number of electronic components is two in the circuit apparatus 100 according to the present embodiment, but the number of electronic components is not limited to this.

The sealing member 20 is provided on the wiring substrate 60 and covers the first electronic component 2 and the second electronic component 4. The sealing member 20 is, for example, a thermosetting epoxy resin or ceramic. Furthermore, the sealing member 20 may be a thermosetting epoxy resin or the like including a filler made of silicon oxide, aluminum oxide or the like. Note that the configuration of the sealing member 20 is not limited to this.

The sealing member 20 has a first surface 20a above the first electronic component 2. And, the sealing member 20 has a second surface 20b above the second electronic component 4, and the second surface is parallel to the substrate face of the wiring substrate 60. A difference $L_2-h_2$ between a distance $L_2$ between the second surface 20b and the wiring substrate 60 and the height $h_2$ of the second electronic component 4 is, for example, about several µm to several tens µm.

Further, the height of the sealing member 20 is the highest at the portion having the second surface 20b and becomes lower as being away from the second surface 20b. A distance $L_1$ between the first surface 20a of the sealing member 20 above the first electronic component 2 and the wiring substrate 60 is shorter than the distance $L_2$ between the second surface 20b and the wiring substrate 60. In other words, the distance $L_2$ between the second surface 20b and the wiring substrate 60 is longer than a distance $L_1$ between the first surface 20a of the sealing member 20 above the first electronic component 2 and the wiring substrate 60. This is because the height $h_2$ of the second electronic component 4 is higher than the height $h_1$ of the first electronic component 2 and thus the height around the second surface 20b becomes lower when the sealing member 20 is formed.

Moreover, an area $S_1$ of the exposed second surface is smaller than an area $S_2$ of the upper face of the second electronic component 4. Herein, the area $S_1$ of the second surface and the area $S_2$ of the upper face of the second electronic component 4 can be evaluated by, for example, analyzing the circuit apparatus 100 with a commercially available X-ray transmission observation apparatus or the like.

A conductive member 10 has the conductive members 11, 12 and 13. The conductive members 11 and 12 are provided on the sealing member 20 and expose the second surface 20b and integrally surround the second surface 20b. The upper face of the conductive member 11 is a flat face integrated with the second surface 20b. In other words, a third distance $L_3$ between a third surface 11a of the conductive member 11 provided above the first electronic component 2 and the wiring substrate 60 is equal to the second distance $L_2$. Furthermore, the upper face of the conductive member 12 is a flat surface integrated with the second surface 20b. In other words, a fourth distance $L_4$ between a fourth surface 12a of the conductive member 12 and the wiring substrate 60 is equal to the second distance $L_2$.

A film thickness $t_1$ of the conductive member 11 at the third surface 11a is thicker than a film thickness $t_2$ of the conductive member 11 at the fourth surface 11b provided between the third surface 11a and the second surface 20b.

The film thickness $t_1$ of the conductive member 11 above the first electronic component 2 is preferably 1 μm or more and 30 μm or less.

Figure 2A:
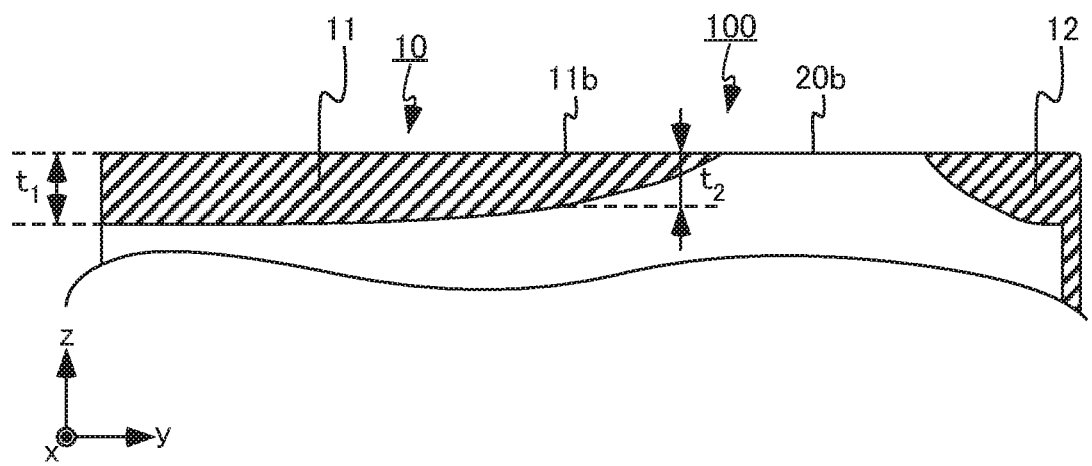
FIGS. 2A and 2B are schematic sectional views showing examples in which the film thickness of the conductive member is continuously changed and discontinuously changed.
Figure 2B:
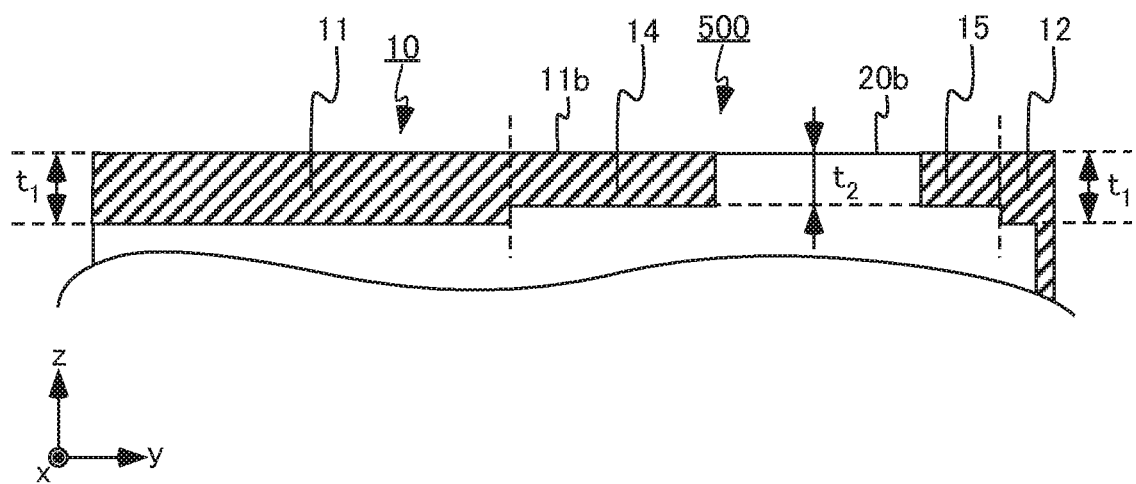

FIGS. 2A and 2B are schematic sectional views showing examples in which the film thickness of the conductive member 10 is continuously changed and discontinuously changed. FIG. 2A shows a part of a schematic sectional view of the circuit apparatus 100 according to the present embodiment in which the film thickness of the conductive member 10 is continuously changed. FIG. 2B shows a part of a schematic sectional view of a circuit apparatus 500 according to a comparative embodiment in which a film thickness of a conductive member 10 is discontinuously changed.

In the circuit apparatus 500, a film thickness of a conductive member 14 is constant at $t_2$, and a film thickness of a conductive member 11 is constant at $t_1$. Then, the film thickness is changed discontinuously from $t_2$ to $t_1$ between the conductive member 14 and the conductive member 11. Note that the film thickness is similarly changed discontinuously from $t_2$ to $t_1$ between a conductive member 15 and a conductive member 12. On the other hand, the film thickness of the conductive member 11 is continuously changed from $t_2$ to $t_1$ in the circuit apparatus 100.

The conductive member 13 is provided so as to extend over the side face of the sealing member 20 and the side face of the wiring substrate 60 on the right side of drawings in FIGS. 1A and 1B. The conductive member 13 is connected to the conductive member 12 at the upper right portion of the drawing in FIG. 1A. Moreover, the conductive member 13 is connected to the wiring 64e at the side face of the wiring substrate 60 and is connected to the external extraction electrode 80 through a via 66a. The external extraction electrode 80 is connected to a ground (not shown) when being mounted on a mounting substrate (not shown).

The conductive members 11, 12 and 13 are films containing, for example, silver. The conductive members 11, 12 and 13 are formed by, for example, sputtering or printing.

Note that the number of electronic components is two in the circuit apparatus 100 according to the present embodiment. However, the number of electronic components is not limited to two.

Figure 3A:
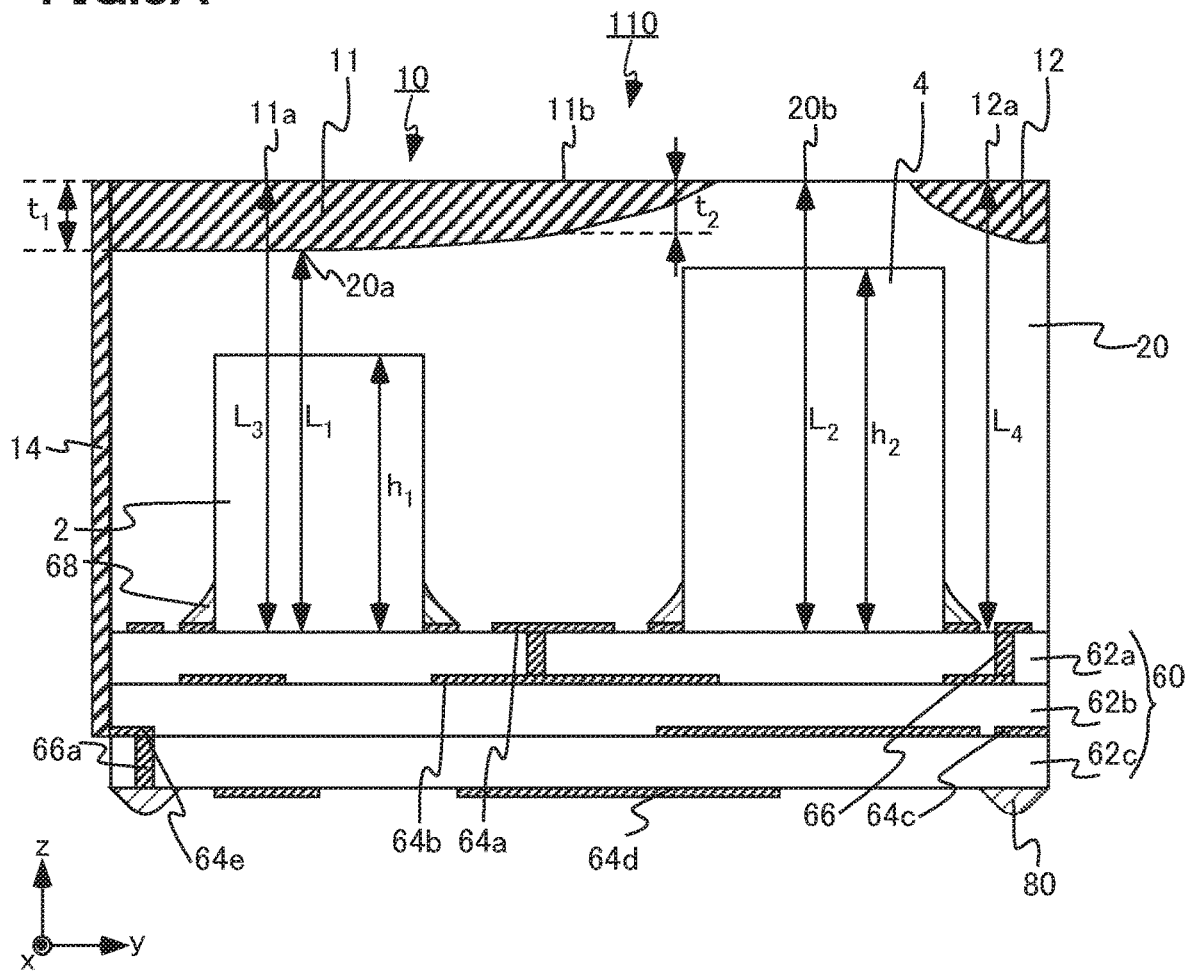
FIGS. 3A and 3B are schematic views of a circuit apparatus according to another aspect of the first embodiment.
Figure 3B:
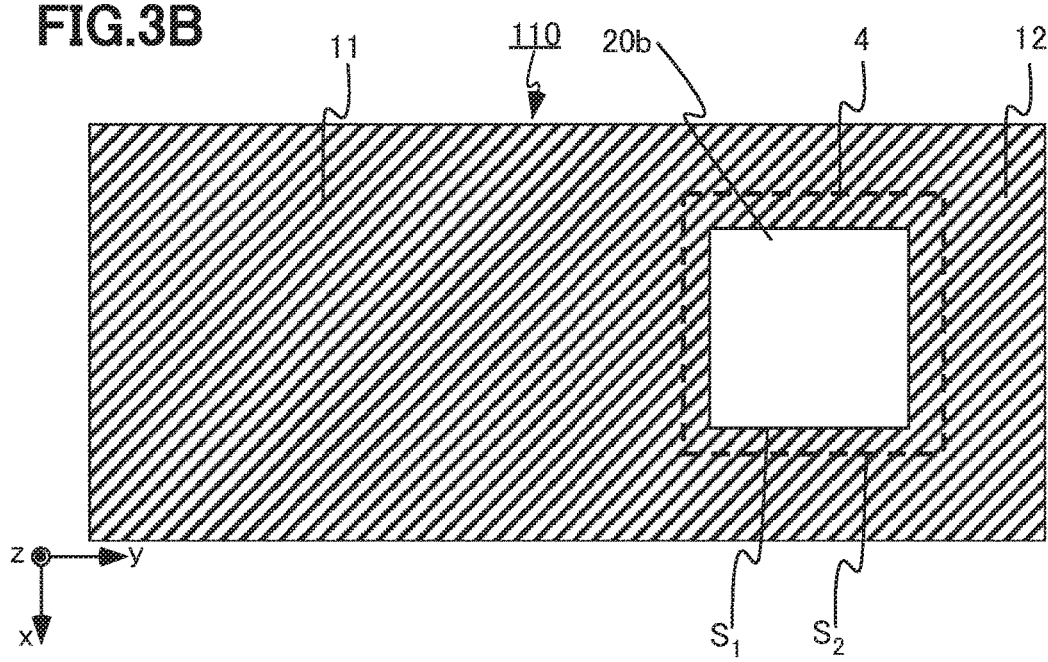

FIGS. 3A and 3B are schematic views of a circuit apparatus 110 according to another aspect of the present embodiment. The circuit apparatus 110 is the same as the circuit apparatus 100 shown in FIGS. 1A and 1B except that a conductive member 14 is provided on the left side of FIGS. 3A and 3B.

Figure 4A:
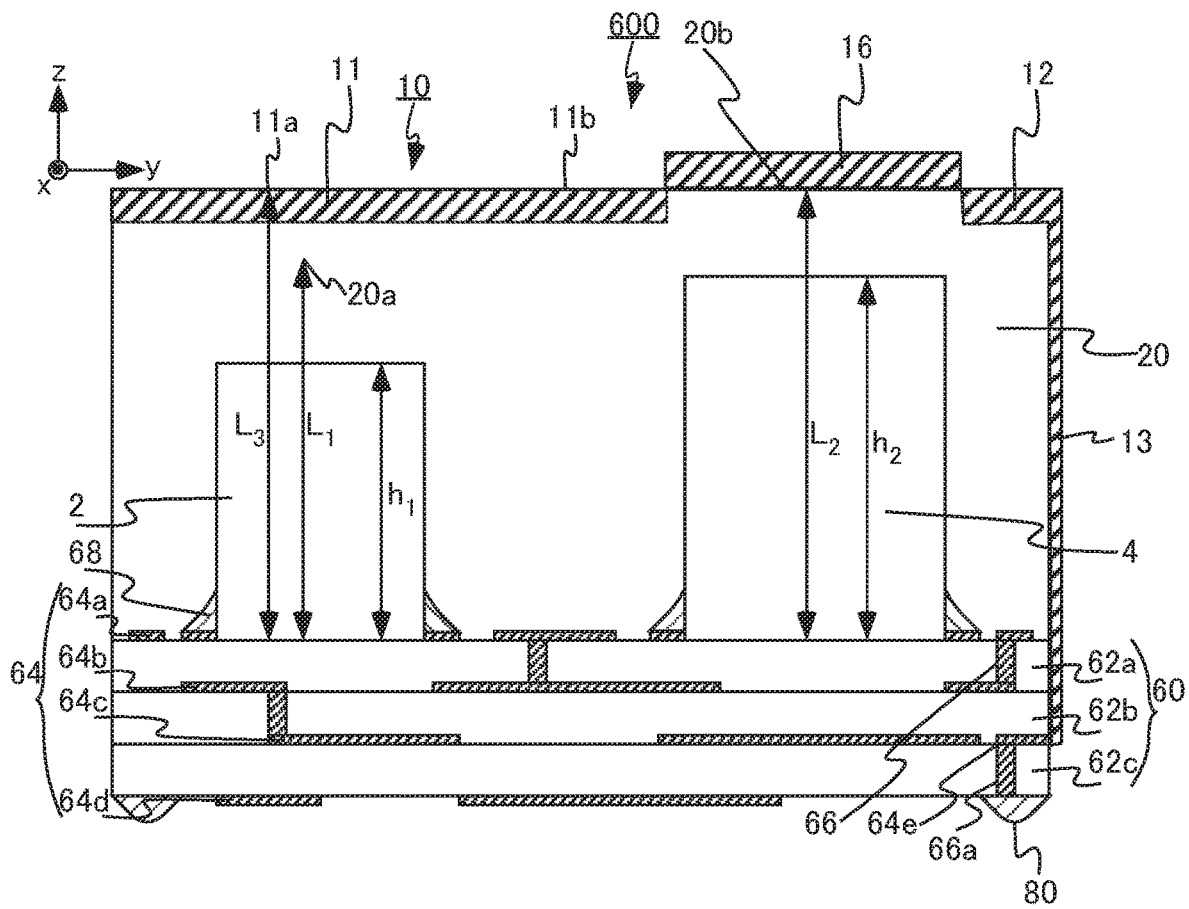
FIGS. 4A and 4B are schematic sectional views of a circuit apparatus according to a comparative embodiment.
Figure 4B:
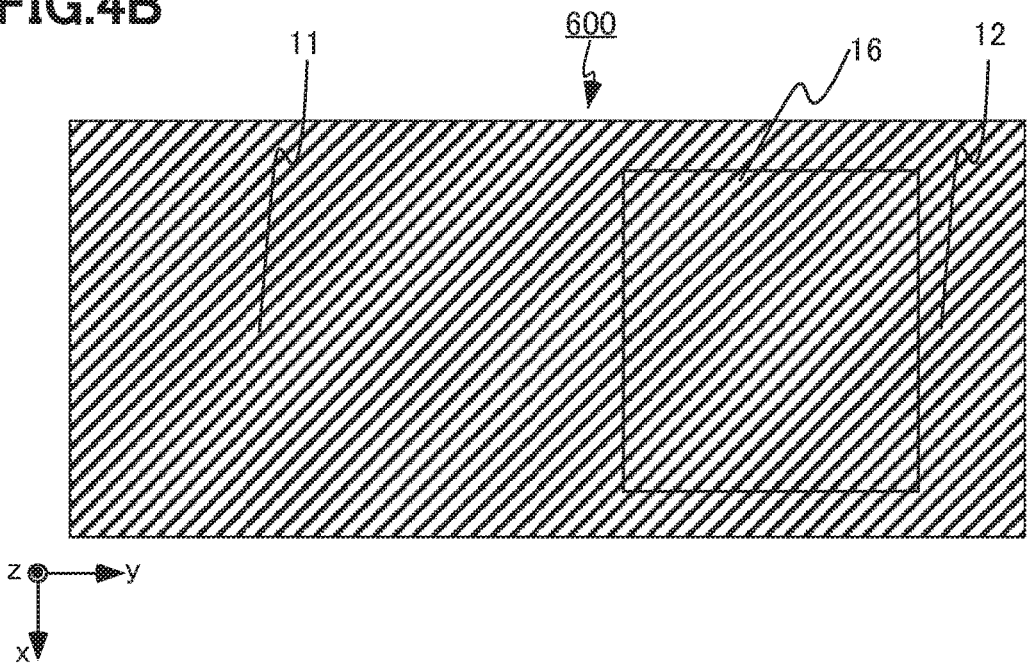

FIGS. 4A and 4B are schematic sectional views of a circuit apparatus 600 according to a comparative embodiment of the present embodiment. In the circuit apparatus 600, a second surface 20b is not exposed, and a conductive member 11 is also formed on the second surface 20b.

Next, the effects of the circuit apparatus according to the present embodiment will be described.

The sizes of a plurality of electronic components mounted on the surface of a wiring substrate are not necessarily the same. In a case where a plurality of electronic components having different sizes are mounted on the wiring substrate, it is difficult to uniform the height of the upper face of the circuit apparatus even when the electronic components are sealed by a sealing member. This is because, in many cases, the upper face (second surface 20b) of the sealing member formed on the electronic component with a higher height becomes higher, whereas the upper face (first surface 20a) of the sealing member formed on the electronic component with a lower height becomes lower. Therefore, for transportation of the circuit apparatus, even when the upper face of the circuit apparatus is attracted by a suction collet or the like for the transportation, a gap is formed between the tip of the suction collet and the upper face of the circuit apparatus. Thus, there has been a problem that the circuit apparatus cannot be attracted well.

Even if the upper face of the circuit apparatus could have been attracted by using the suction collet, the attraction state is not stable. Thus, there has been a problem that the positional deviation of the circuit apparatus occurs in a case where the circuit apparatus attracted to the tip of the suction collet is mounted on a mounting substrate.

Moreover, in order to manufacture with good reproducibility a circuit apparatus having an upper face with a uniform height, it is preferable to take into consideration all of the height tolerance of each electronic component, the variation in the height of solder when mounting on the wiring substrate is performed by using the solder or the like, and the film thickness of the sealing member provided on the electronic components. For example, if the height of the electronic components is 1 mm, the height tolerance of the electronic components is usually about ±0.1 mm. And, the variation in the height of the solder is about ±50 μm. Furthermore, the film thickness of the sealing member provided on the electronic components is usually several μm or more and several tens μm or less. Since the above variations occur in these dimensions in each circuit apparatus, it is difficult to manufacture with good reproducibility a circuit apparatus which has an upper face with a uniform height and is easy to handle.

Further, even if a shield is formed on the surface of the sealing member of the circuit apparatus, the shape of the upper face of the sealing member is reflected in the shape of the formed shield. Thus, it has been difficult to solve the above problems.

In the circuit apparatus according to the present embodiment, the conductive member 10 is provided so as to expose the second surface 20b. Then, the third distance $L_3$ between the third surface 11a and the wiring substrate 60 is equal to the second distance $L_2$, and the film thickness $t_1$ of the conductive member 11 at the third surface 11a is thicker than the film thickness $t_2$ of the conductive member 11 at the fourth surface 11b of the conductive member 11 provided between the third surface 11a and a second surface 20b.

This can make the height of the upper face of the circuit apparatus more uniform. Moreover, since the circuit apparatus itself can possess a shield, it is possible to take a countermeasure against the electromagnetic noise of the circuit apparatus while the circuit apparatus including the shield is miniaturized. That is, it is possible to provide a circuit apparatus which is small, has a more uniform upper face, is easy to handle by a suction collet, and is easy to handle on the mounting substrate since the countermeasure against the electromagnetic noise is taken.

In the circuit apparatus according to the present embodiment, the height of the sealing member 20 is continuously changed from the second surface 20b to the first surface 20a. By forming the conductive member 10, the height of this sealing member 20, which is continuously changed, is compensated in a sense to make the height of the upper face of the circuit apparatus more uniform. This makes the circuit apparatus easy to handle. Therefore, the film thickness of the conductive member 10 has a portion continuously changed between the second surface 20b and the third surface 11a.

Silver is preferably used for the conductive member 10 since silver has less chemical changes, is easy to handle and has excellent shielding performance.

The crystal oscillator generates a relatively large noise, but the height is relatively short. For this reason, it is preferable to use the crystal oscillator as the first electronic component 2, and it is preferable to shield noise generated by the conductive member 11 formed with a thicker film thickness to take a countermeasure against the noise.

On the other hand, since the amplification device is a component with a relatively high height, the amplification device is preferably used as the second electronic component 4.

According to the circuit apparatus of the present embodiment, it is possible to provide a circuit apparatus which is small in size and easy handle.

Second Embodiment

A circuit apparatus according to the present embodiment is different from that according to the first embodiment in that a conductive member 10 is an antenna conductor connected to a first electronic component 2 or a second electronic component 4 through a connection member 70 provided inside a sealing member 20. Herein, explanations overlapping with those of the first embodiment are omitted.

Figure 5A:
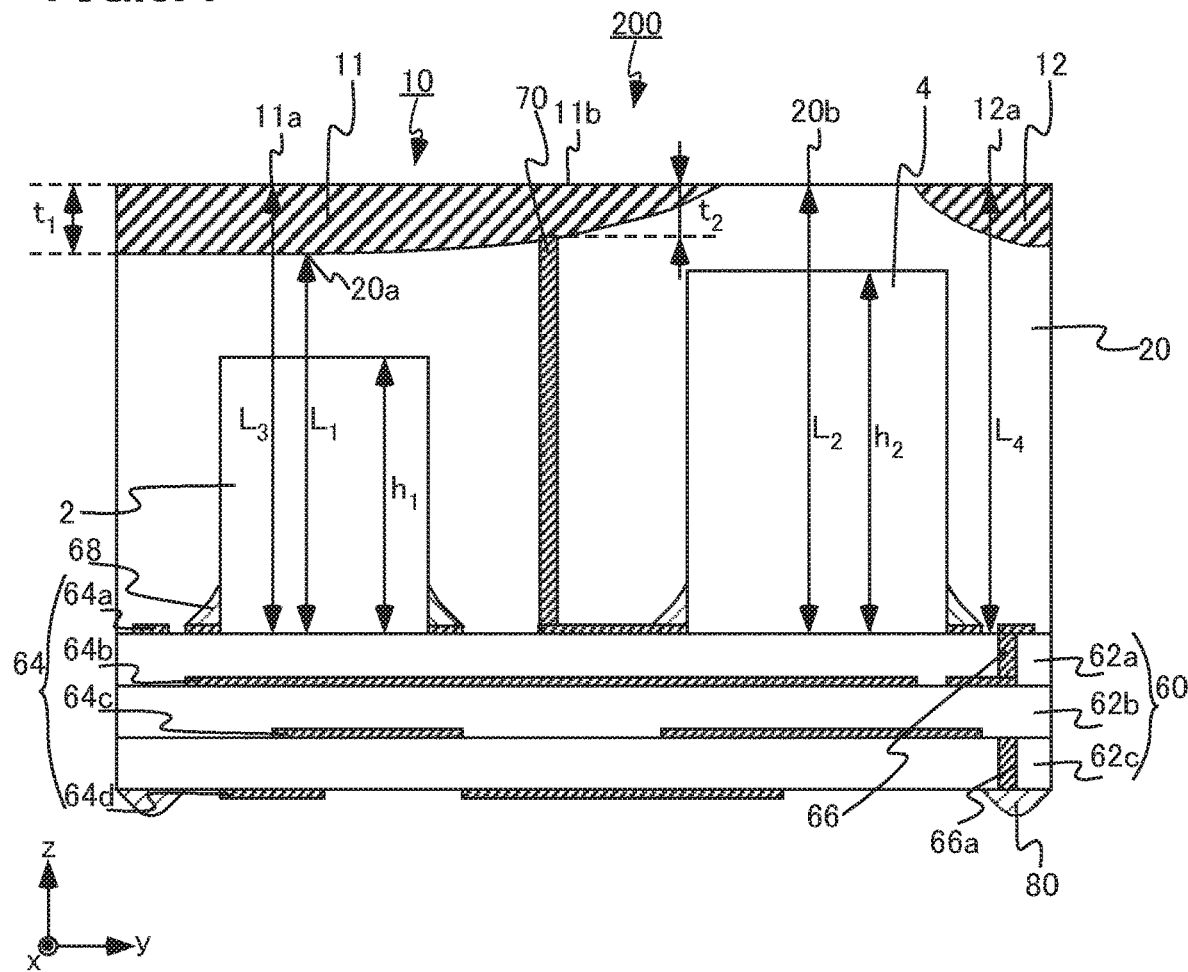
FIGS. 5A and 5B are schematic sectional views of a circuit apparatus according to a second embodiment.
Figure 5B:
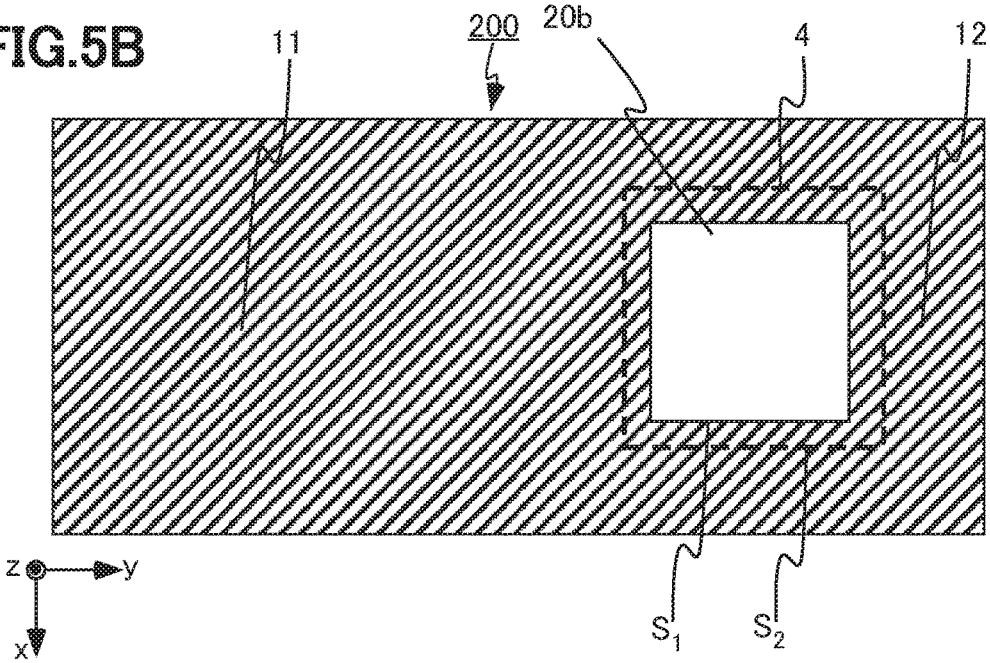

FIGS. 5A and 5B are schematic views of a circuit apparatus 200 according to the present embodiment.

The conductive member 10 is used as, for example, a patch (antenna conductor) of a patch antenna. Herein, the size and shape of each of conductive members 11 and 12 can be designed and changed appropriately according to the frequency and intensity of a signal desired to be transmitted and received. Then, for example, a wiring 64b provided in a wiring substrate 60 can be used as a ground of the patch antenna. The connection member 70 can be used as, for example, an electric supply line for the patch antenna.

For example, in a case where the second electronic component 4 is an amplification device and the connection member 70 is connected to the second electronic component 4, the signal amplified by the amplification device can be transmitted well by the patch antenna. Since the antenna conductor is provided on the outermost face of the circuit apparatus, a stronger signal can be transmitted and received.

According to the circuit apparatus of the present embodiment, it is possible to provide a circuit apparatus which is small in size and easy handle.

While certain embodiments have been described, these embodiments have been presented by way of example only, and are not intended to limit the scope of the inventions. Indeed, a circuit apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A circuit apparatus comprising:
a wiring substrate having a wiring;
a first electronic component provided on the wiring substrate;
a second electronic component provided on the wiring substrate, the second electronic component having a height higher than a height of the first electronic component;
a sealing member provided on the wiring substrate, the sealing member covering the first electronic component and the second electronic component, a first distance between a first surface of the sealing member above the first electronic component and the wiring substrate being shorter than a second distance between a second surface of the sealing member above the second electronic component and the wiring substrate; and
a conductive member provided on the sealing member, the conductive member exposing the second surface, a third distance between a third surface of the conductive member provided above the first electronic component and the wiring substrate being equal to the second distance, and a film thickness of the conductive member at the third surface being thicker than a film thickness of the conductive member at a fourth surface provided between the third surface and the second surface.

2. The circuit apparatus according to claim 1, wherein the film thickness of the conductive member has a portion continuously changed between the second surface and the third surface.

3. The circuit apparatus according to claim 1, wherein an area of the second surface exposed is smaller than an area of an upper face of the second electronic component.

4. The circuit apparatus according to claim 1, wherein the conductive member is provided to surround the second surface.

5. The circuit apparatus according to claim 1, wherein the conductive member includes silver.

6. The circuit apparatus according to claim 1, wherein the film thickness of the conductive member above the first electronic component is 1 µm or more and 30 µm or less.

7. The circuit apparatus according to claim 1, wherein the conductive member is a shield connected to the wiring.

8. The circuit apparatus according to claim 1, wherein the conductive member is an antenna conductor connected to the first electronic component or the second electronic component through a connection member provided inside the sealing member.

9. The circuit apparatus according to claim 1, wherein the first electronic component includes a crystal oscillator.

10. The circuit apparatus according to claim 1, wherein the second electronic component includes an amplification device.

* * * * *